United States Patent
Davis et al.

[11] Patent Number: 6,051,849
[45] Date of Patent: Apr. 18, 2000

[54] GALLIUM NITRIDE SEMICONDUCTOR STRUCTURES INCLUDING A LATERAL GALLIUM NITRIDE LAYER THAT EXTENDS FROM AN UNDERLYING GALLIUM NITRIDE LAYER

[75] Inventors: Robert F. Davis, Raleigh, N.C.; Ok-Hyun Nam, Seoul, Rep. of Korea; Tsvetanka Zheleva, Chapel Hill, N.C.; Michael D. Bremser, Lynchburg, Va.

[73] Assignee: North Carolina State University, Raleigh, N.C.

[21] Appl. No.: 09/032,190

[22] Filed: Feb. 27, 1998

[51] Int. Cl.[7] .................................................. H01V 33/00
[52] U.S. Cl. ............................................................ 257/103
[58] Field of Search ................................. 257/76, 94, 96, 257/103

[56] References Cited

U.S. PATENT DOCUMENTS

| | | | |
|---|---|---|---|
| Re. 34,861 | 2/1995 | Davis et al. | 437/100 |
| 4,127,792 | 11/1978 | Nakata | 313/500 |
| 4,522,661 | 6/1985 | Morrison et al. | 148/33.2 |
| 4,651,407 | 3/1987 | Bencuya | 29/571 |
| 4,865,685 | 9/1989 | Palmour | 156/643 |
| 4,876,210 | 10/1989 | Barnett et al. | 437/5 |
| 4,912,064 | 3/1990 | Kong et al. | 437/100 |
| 4,946,547 | 8/1990 | Palmour et al. | 156/643 |
| 5,122,845 | 6/1992 | Manabe et al. | 357/17 |
| 5,389,571 | 2/1995 | Takeuchi et al. | 437/133 |
| 5,397,736 | 3/1995 | Bauser et al. | 437/92 |
| 5,549,747 | 8/1996 | Bozler et al. | 117/43 |
| 5,710,057 | 1/1998 | Kenney | 437/62 |
| 5,760,426 | 6/1998 | Marx et al. | 257/190 |
| 5,786,606 | 7/1998 | Nishio et al. | 257/103 |
| 5,815,520 | 9/1998 | Furushima | 372/45 |
| 5,877,070 | 9/1999 | Goesele et al. | 438/458 |
| 5,880,485 | 3/1999 | Marx et al. | 257/94 |

FOREIGN PATENT DOCUMENTS

| | | |
|---|---|---|
| 2258080 | 10/1998 | Canada. |
| 0 551 721 A2 | 7/1993 | European Pat. Off.. |
| 8-064791 | 3/1996 | Japan. |
| 9-93315 | 4/1997 | Japan. |
| 9-174494 | 6/1997 | Japan. |
| 9-181071 | 7/1997 | Japan. |
| 9-201477 | 7/1997 | Japan. |
| 9-277448 | 10/1997 | Japan. |
| 9-290098 | 10/1997 | Japan. |
| 9-324997 | 11/1997 | Japan. |
| WO 98/47170 | 10/1998 | WIPO. |

OTHER PUBLICATIONS

Kapolnek et al., "Anisotropic Epitaxial Lateral Growth in GaN Selective Area Epitaxy", Appl. Phys. Lett. 71 (9), Sep. 1, 1997, pp. 1204–1206.

Usui et al., "Thick GaN Epitaxial Growth With Low Dislocation Density by Hydride Vapor Phase Epitaxy", Jpn. J. Appl. Phys., vol. 36, Part 2, No. 7B, Jul. 15, 1997, pp. 899–902.

Nam, et al., "Growth of GaN and $Al_{0.2}Ga_{0.8}N$ on Patterned Substrates Via Organometallic Vapor Phase Epitaxy", Jpn. J. Appl. Phys., vol. 36, Part 2, No. 5A, May 1, 1997, pp. 532–535.

(List continued on next page.)

*Primary Examiner*—Brian Dutton
*Attorney, Agent, or Firm*—Myers Bigel Sibley & Sajovec

[57] ABSTRACT

A gallium nitride semiconductor layer is fabricated by masking an underlying gallium nitride layer with a mask that includes an array of openings therein, and growing the underlying gallium nitride layer through the array of openings and onto the mask, to thereby form an overgrown gallium nitride semiconductor layer. Although dislocation defects may propagate vertically from the underlying gallium nitride layer to the grown gallium nitride layer through the mask openings, the overgrown gallium nitride layer is relatively defect free. The overgrown gallium nitride semiconductor layer may be overgrown until the overgrown gallium nitride layer coalesces on the mask, to form a continuous overgrown monocrystalline gallium nitride semiconductor layer. The gallium nitride semiconductor layer may be grown using metalorganic vapor phase epitaxy. Microelectronic devices may be formed in the overgrown gallium nitride semiconductor layer.

25 Claims, 2 Drawing Sheets

OTHER PUBLICATIONS

Nam et al., "Selective Growth of GaN and $Al_{0.2}Ga_{0.8}N$ on GaN/AlN/6H–SiC(0001) Multilayer Substrates Via Organometallic Vapor Phase Epitaxy", Proceedings MRS, Dec. 1996, 6 pp.

Kapolnek et al., "Selective Area Epitaxy of GaN for Electron Field Emission Devices", Journal of Crystal Growth, 5451, 1996, pp. 1–4.

Weeks et al, "GaN Thin Films Deposited Via Organometallic Vapor Phase Epitaxy on α(6H)–SiC(0001) Using High–Temperature Monocrystalline AlN Buffer Layers", Appl. Phys. Lett. 67 (3), 17 Jul. 1995, pp. 401–403.

Kato et al., "Selective Growth of Wurtzite GaN and $Al_x$-$Ga_{1-x}N$ on GaN/Sapphire Substrates by Metalorganic Vapor Phase Epitaxy", Journal of Crystal Growth, 144, 1994, pp. 133–140.

Yamaguchi et al, "Lateral Supply Mechanisms in Selective Metalorganic Chemical Vapor Deposition", Jpn. Appl. Phys., vol. 32 (1993), pp. 1523–1527.

Nakamura et al., InGaN/GaN/AlGaN–Based Laser Diodes With Modulation–Doped Strained–Layer Superlattices, Jpn. J. Appl. Phys., vol. 36, Dec. 1, 1997, pp. L1568–L1571.

International Search Report, PCT/US99/12967, Oct. 18, 1999.

Linthicum et al., *Pendeoepitaxy of Gallium Nitride Thin Films*, Applied Physics Letters, vol. 75, No. 2, Jul. 12, 1999, pp. 196–198.

Zheleva et al., Pendeo–Epitaxy: *A New Approach for lateral Growth of Gallium Nitride Films*, Journal of Electronic Materials, vol. 28, No. 4, Feb. 1999, pp. L5–L8.

Zheleva et al., *Pendeo–Epitaxy–A New Approach for Lateral Growth of GaN Structures*, MRS Internet Journal of Nitride Semiconductor Research, 1999, Online !, vol. 4S1, No. G3.38, Nov. 30, 1998–Dec. 4, 1998.

Nakamura et al., *InGaN/GaN/AlGaN–Based Laser Diodes Grown on GaN Substrates With a Fundamental Transverse Mode*, Jpn. J. Appl. Phys., vol. 37, Sep. 15, 1998, pp. L1020–L1022.

Marchand et al., *Microstructure of GaN Laterally Overgrown by Metalorganic Chemical Vapor Deposition*, Applied Physics Letters, vol. 73, No. 6, Aug. 10, 1998, pp. 747–749.

Sakai et al., *Transmission Electron Microscopy of Defects in GaN Films Formed by Epitaxial Lateral Overgrowth*, vol. 73, No. 4, Jul. 27, 1998, pp. 481–483.

Nakamura et al., *High–Power, Long–Lifetime InGaN/GaN/AlGaN–Based Laser Diodes Grown on Pure GaN Substrates*, Jpn. J. Appl. Phys., vol. 37, Mar. 15, 1998, pp. L309–L312.

Nam et al., *Lateral Epitaxial Overgrowth of GaN Films on $SiO_2$ Areas Via Metalorganic Vapor Phase Epitaxy*, Journal of Electronic Materials, vol. 27, No. 4, 1998, pp. 233–237.

Wu et al., *Growth and Charaterization of SiC Films on Large–Area Si Wafers by APCVD–Temperature Dependence*, Materials Science Forum, vols. 264–268, 1998, pp. 179–182.

Nam et al., *Lateral Epitaxy of Low Defect Density GaN Layers Via Organometallic Vapor Phase Epitaxy*, Appl. Phys. Lett., vol. 71, No. 18, Nov. 3, 1997, pp. 2638–2640.

Zheleva et al., *Dislocation Density Reduction Via Lateral Epitaxy in Selectively Grown GaN Structures*, Appl. Phys. Lett., vol. 71, No. 17, Oct. 27, 1997, pp. 2472–2474.

Doverspike et al., *The Effect of GaN and AlN Buffer Layers on GaN Film Properties Grown on Both C–Plane and A–Plane Sapphire*, Journal of Electronic Materials, vol. 24, No. 4, 1995, pp. 269–273.

Kuznia et al., *Influence of Buffer Layers on the Deposition of High Quality Single Crystal GaN Over Sapphire Substrates*, J. Appl. Phys., vol. 73, No. 9, May 1, 1993, pp. 4700–4702.

Watanabe et al., *The Growth of Single Crystalline GaN on a Si Substrate Using AlN As An Intermediate Layer*, Journal of Crystal Growth, vol. 128, 1993, pp. 391–396.

Nakamura, *GaN Growth Using GaN Buffer Layer*, Japanese Journal of Applied Physics, vol. 30, No. 10A, Oct. 1991, pp. L1705–L1707.

Chen et al., *Silicon–on–Insulator: Why How, and When*, AIP Conference Proceedings, vol. 167, No. 1, Sep. 15, 1988, pp. 310–319.

Amano et al., *Metalorganic Vapor Phase Epitaxial Growth of a High Quality GaN Film Using an AlN Buffer Layer*, Applied Physics Letters, vol. 48, No. 5, Feb. 3, 1986, pp. 353–355.

Yoshida et al., *Improvements on the Electrical and Luminescent Properties of Reactive Molecular Beam Epitaxially Grown GaN Films by Using AlN–Coated Sapphire Substrates*, Applied Physics Letters, vol. 42, No. 5 Mar. 1, 1983, pp. 427–429.

GALLIUM NITRIDE SEMICONDUCTOR STRUCTURES INCLUDING A LATERAL GALLIUM NITRIDE LAYER THAT EXTENDS FROM AN UNDERLYING GALLIUM NITRIDE LAYER

FEDERALLY SPONSORED RESEARCH

This invention was made with Government support under Office of Naval Research Contact No. N00014-96-1-0765. The Government has certain rights to this invention.

FIELD OF THE INVENTION

This invention relates to microelectronic devices and fabrication methods, and more particularly to gallium nitride semiconductor devices and fabrication methods therefor.

BACKGROUND OF THE INVENTION

Gallium nitride is being widely investigated for microelectronic devices including but not limited to transistors, field emitters and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is the substrate on which the gallium nitride layer is grown. Accordingly, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in defect density is desirable.

It is also known to fabricate gallium nitride structures through openings in a mask. For example, in fabricating field emitter arrays, it is known to selectively grow gallium nitride on stripe or circular patterned substrates. See, for example, the publications by coinventor Nam et al. entitled "Selective Growth of GaN and $Al_{0.2}Ga_{0.8}N$ on GaN/AlN/6H—SiC(0001) Multilayer Substrates Via Organometallic Vapor Phase Epitaxy", Proceedings of the Materials Research Society, December 1996, and "Growth of GaN and $Al_{0.2}Ga_{0.8}N$ on Patterened Substrates via Organometallic Vapor Phase Epitaxy", Japanese Journal of Applied Physics., Vol. 36, Part 2, No. 5A, May 1997, pp. L-532–L535. As disclosed in these publications, undesired ridge growth or lateral overgrowth may occur under certain conditions.

SUMMARY OF THE INVENTION

It is therefore an object of the present invention to provide improved methods of fabricating gallium nitride semiconductor layers, and improved gallium nitride layers so fabricated.

It is another object of the invention to provide methods of fabricating gallium nitride semiconductor layers that can have low defect densities, and gallium nitride semiconductor layers so fabricated.

These and other objects are provided, according to the present invention, by fabricating a gallium nitride semiconductor layer by laterally growing an underlying gallium nitride layer to thereby form a laterally grown gallium nitride semiconductor layer, and forming microelectronic devices in the laterally grown gallium nitride semiconductor layer. In a preferred embodiment, a gallium nitride semiconductor layer is fabricated by masking an underlying gallium nitride layer with a mask that includes an array of openings therein and growing the underlying gallium nitride layer through the array of openings and onto the mask, to thereby form an overgrown gallium nitride semiconductor layer. Microelectronic devices may then be formed in the overgrown gallium nitride semiconductor layer.

It has been found, according to the present invention, that although dislocation defects may propagate vertically from the underlying gallium nitride layer to the grown gallium nitride layer above the mask openings, the overgrown gallium nitride layer is relatively defect-free. Accordingly, high performance microelectronic devices may be formed in the overgrown gallium nitride semiconductor layer.

According to another aspect of the present invention, the overgrown gallium nitride semiconductor layer is overgrown until the overgrown gallium nitride layer coalesces on the mask, to form a continuous overgrown monocrystalline gallium nitride semiconductor layer. The overgrown layer can thus have overgrown regions of relatively low defect in the area of coalescence and regions of relatively high defects over the mask openings.

The gallium nitride semiconductor layer may be grown using metalorganic vapor phase epitaxy (MOVPE). Preferably, the openings in the mask are stripes that are oriented along the <1$\bar{1}$00> direction of the underlying gallium nitride layer. The overgrown gallium nitride layer may be grown using triethylgallium (TEG) and ammonia ($NH_3$) precursors at 1000–1100° C. and 45 Torr. Preferably, TEG at 13–39 μmol/min and $NH_3$ at 1500 sccm are used in combination with 3000 sccm $H_2$ diluent. Most preferably, TEG at 26 μmol/min, $NH_3$ at 1500 sccm and 112 at 3000 sccm at a temperature of 1100° C. and 45 Torr are used. The underlying gallium nitride layer preferably is formed on a substrate, which itself includes a buffer layer such as aluminum nitride, on a substrate such as 6H—SiC(0001).

Gallium nitride semiconductor structures according to the present invention include an underlying gallium nitride layer, a lateral gallium nitride layer that extends from the underlying gallium nitride layer, and a plurality of microelectronic devices in the lateral gallium nitride layer. In a preferred embodiment, gallium nitride semiconductor structures according to the present invention include an underlying gallium nitride layer and a patterned layer (such as a mask) that includes an array of openings therein, on the underlying gallium nitride layer. A vertical gallium nitride layer extends from the underlying gallium nitride layer through the array of openings. A lateral gallium nitride layer extends from the vertical gallium nitride layer onto the patterned layer, opposite the underlying gallium nitride layer. A plurality of microelectronic devices including but not limited to optoelectronic devices and field emitters, are formed in the lateral gallium nitride layer.

Preferably, the lateral gallium nitride layer is a continuous monocrystalline gallium nitride semiconductor layer. The underlying gallium nitride layer and the vertical gallium nitride layer both include a predetermined defect density, and the lateral gallium nitride semiconductor layer is of lower defect density than the predetermined defect density. Accordingly, low defect density gallium nitride semiconductor layers may be produced, to thereby allow the production of high-performance microelectronic devices.

DETAILED DESCRIPTION OF PREFERRED EMBODIMENTS

Figure 1:
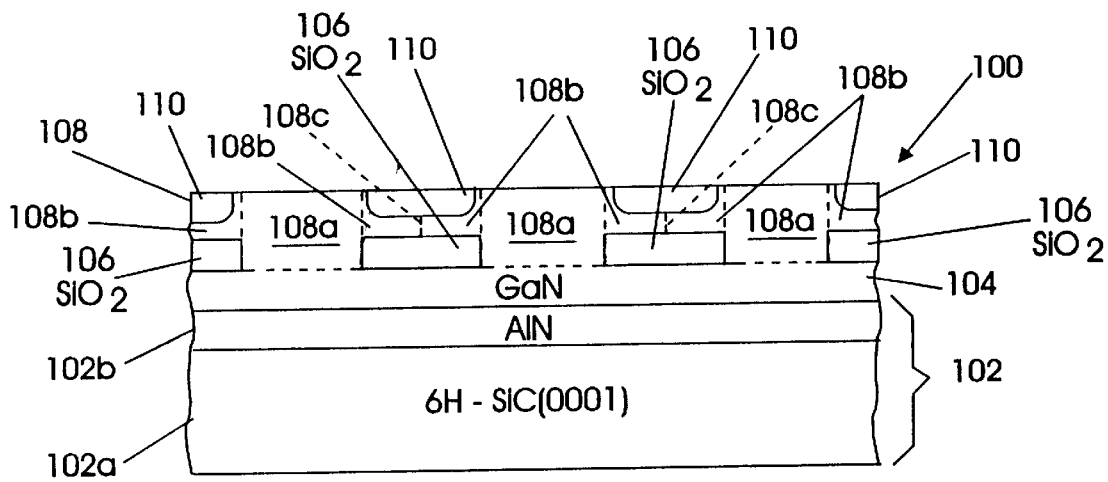
FIG. 1 is a cross-sectional view of gallium nitride semiconductor structures according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Referring now to FIG. 1, gallium nitride semiconductor structures according to the present invention are illustrated. The gallium nitride structures 100 include a substrate 102. The substrate may be sapphire or gallium nitride. However, preferably, the substrate includes a 6—SiC(0001) substrate 102a and an aluminum nitride buffer layer 102b on the silicon carbide substrate 102a The aluminum nitride buffer layer 102b may 0.01 µm thick.

The fabrication of substrate 102 is well known to those having skill in the art and need not be described further. Fabrication of silicon carbide substrates are described, for example, in U.S. Pat. No. 4,865,685 to Palmour; U.S. Pat. No. Re 34,861 to Davis et al.; U.S. Pat. No. 4,912,064 to Kong et al. and U.S. Pat. No. 4,946,547 to Palmour et al., the disclosures of which are hereby incorporated herein by reference. Also, the crystallographic designation conventions used herein are well known to those having skill in the art, and need not be described further.

An underlying gallium nitride layer 104 is also included on buffer layer 102b opposite substrate 102a. The underlying gallium nitride layer 104 may be between about 1.0 and 2.0 cm thick, and may be formed using heated metalorganic vapor phase epitaxy (MOVPE). The underlying gallium nitride layer generally has an undesired relatively high defect density, for example dislocation densities of between about $10^8$ and $10^{10}$ cm$^{-2}$. These high defect densities may result from mismatches in lattice parameters between the buffer layer 102b and the underlying gallium nitride layer 104. These high defect densities may impact performance of microelectronic devices formed in the underlying gallium nitride layer 104.

Still continuing with the description of FIG. 1, a mask such as a silicon dioxide mask 106 is included on the underlying gallium nitride layer 104. The mask 106 includes an array of openings therein. Preferably, the openings are stripes that extend along the <1$\bar{1}$00> direction of the underlying gallium nitride layer 104. The mask 106 may have a thickness of about 1000 Å and may be formed on the underlying gallium nitride layer 104 using low pressure chemical vapor deposition (CVD) at 410° C. The mask 106 may be patterned using standard photolithography techniques and etched in a buffered hydrofluoric acid (HF) solution.

Continuing with the description of FIG. 1, a vertical gallium nitride layer 108a extends from the underlying gallium nitride layer 104 and through the array of openings in the mask 106. As used herein, the term "vertical" means a direction that is orthogonal to the faces of the substrate 102. The vertical gallium nitride layer 108a may be formed using metalorganic vapor phase epitaxy at about 1000–1100° C. and 45 Torr. Precursors of triethygallium (TEG) at 13–39 µmol/min and ammonia (NH$_3$) at 1500 seem may be used in combination with a 3000 seem H$_2$ diluent, to form the vertical gallium nitride layer 108a.

Still continuing with the description of FIG. 1, the gallium nitride semiconductor structure 100 also includes a lateral gallium nitride layer 108b that extends laterally from the vertical gallium nitride layer 108a onto the mask 106 opposite the underlying gallium nitride layer 104. The lateral gallium nitride layer 108b may be formed using metalorganic vapor phase epitaxy as described above. As used herein, the term "lateral" denotes a direction parallel to the faces of substrate 102.

As shown in FIG. 1, lateral gallium nitride layer 108b coalesces at interfaces 108c to form a continuous monocrystalline gallium nitride semiconductor layer 108. It has been found that the dislocation densities in the underlying gallium nitride layer 104 generally do not propagate laterally with the same intensity as vertically. Thus, lateral gallium nitride layer 108b can have a relatively low defect density, for example less that $10^4$ cm$^{-2}$. Accordingly, lateral gallium nitride layer 108b may form device quality gallium nitride semiconductor material. Thus, as shown in FIG. 1, microelectronic devices 110 may be formed in the lateral gallium nitride layer 108b.

Figure 2:
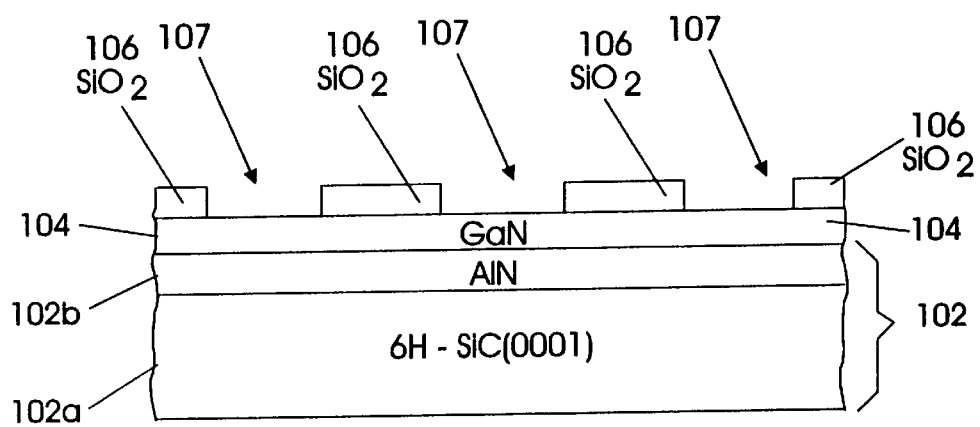
FIGS. 2–5 are cross-sectional views of structures of FIG. 1 during intermediate fabrication steps, according to the present invention.

Referring now to FIGS. 2–5, methods of fabricating gallium nitride semiconductor structures according to the present invention will now be described. As shown in FIG. 2, an underlying gallium nitride layer 104 is grown on a substrate 102. The substrate 102 may include a 6—SiC (0001) substrate 102a and an aluminum nitride buffer layer 102b. The gallium nitride layer 104 may be between 1.0 and 2.0 µm thick, and may be grown at 1000° C. on a high temperature (1100° C.) aluminum nitride buffer layer 102b that was deposited on 6—SiC substrate 102a in a cold wall vertical and inductively heated metalorganic vapor phase epitaxy system using triethylgallium at 26 µmol/min, ammonia at 1500 seem and 3000 seem hydrogen diluent. Additional details of this growth technique may be found in a publication by T. W. Weeks et al. entitled "*GaN Thin Films Deposited Via Organometallic Vapor Phase Epitaxy on α(6)—SiC(0001) Using High-Temperature Monocrystalline AlN Buffer Layers*", Applied Physics Letters, Vol. 67, No. 3, Jul. 17, 1995, pp. 401–403, the disclosure of which is hereby incorporated herein by reference. Other substrates, with or without buffer layers, may be used.

Still referring to FIG. 2, the underlying gallium nitride layer 104 is masked with a mask 106 that includes an array of openings 107 therein. The mask may comprise silicon dioxide at thickness of 1000 Å and may be deposited using low pressure chemical vapor deposition at 410° C. Other masking materials may be used. The mask may be patterned using standard photolithography techniques and etching in a buffered HF solution. In one embodiment, the openings 107 are 3 µm-wide openings that extend in parallel at distances of between 3 and 40 µm and that are oriented along the <1$\bar{1}$00> direction on the underlying gallium nitride layer 104. Prior to further processing, the structure may be dipped in a 50% buffered hydrochloric acid (HCl) solution to remove surface oxides from the underlying gallium nitride layer 104.

Figure 3:
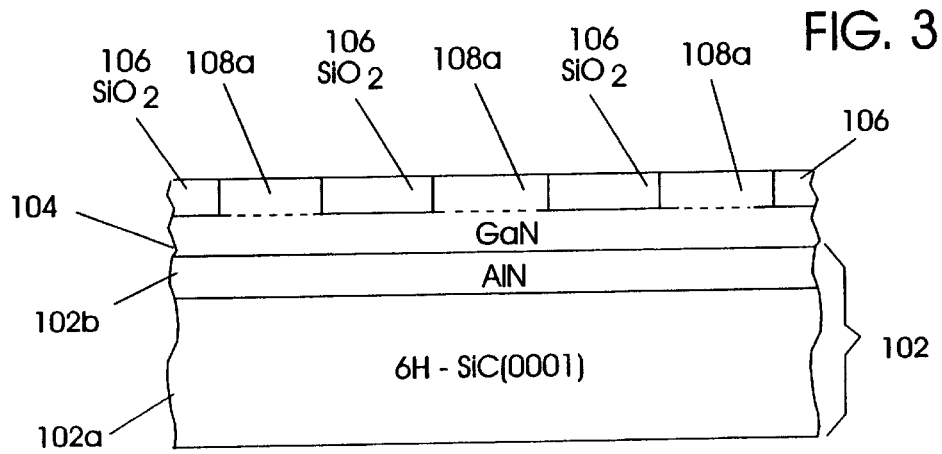

Referring now to FIG. 3, the underlying gallium nitride layer 104 is grown through the array of openings 107 to form vertical gallium nitride layer 108a in the openings. Growth of gallium nitride may be obtained at 1000–1100° C. and 45 Torr. The precursors TEG at 13–39 $\mu$mol/min and NH$_3$ at 1500 sccm may be used in combination with a 3000 sccm H$_2$ diluent. If gallium nitride alloys are formed, additional conventional precursors of aluminum or indium, for example, may also be used. As shown in FIG. 3, the gallium nitride layer 108a grows vertically to the top of the mask 106.

It will be understood that underlying gallium nitride layer 104 may also be grown laterally without using a mask 106, by appropriately controlling growth parameters and/or by appropriately patterning the underlying gallium nitride layer 104. A patterned layer may be formed on the underlying gallium nitride layer after vertical growth or lateral growth, and need not function as a mask.

It will also be understood that lateral growth in two dimensions may be used to form an overgrown gallium nitride semiconductor layer. Specifically, mask 106 may be patterned to include an array of openings 107 that extend along two orthogonal directions such as <1$\bar{1}$00> and <11$\bar{2}$0>. Thus, the openings can form a rectangle of orthogonal striped patterns. In this case, the ratio of the edges of the rectangle is preferably proportional to the ratio of the growth rates of the {11$\bar{2}$0} and {1$\bar{1}$01} facets, for example, in a ratio of 1.4:1.

Figure 4:
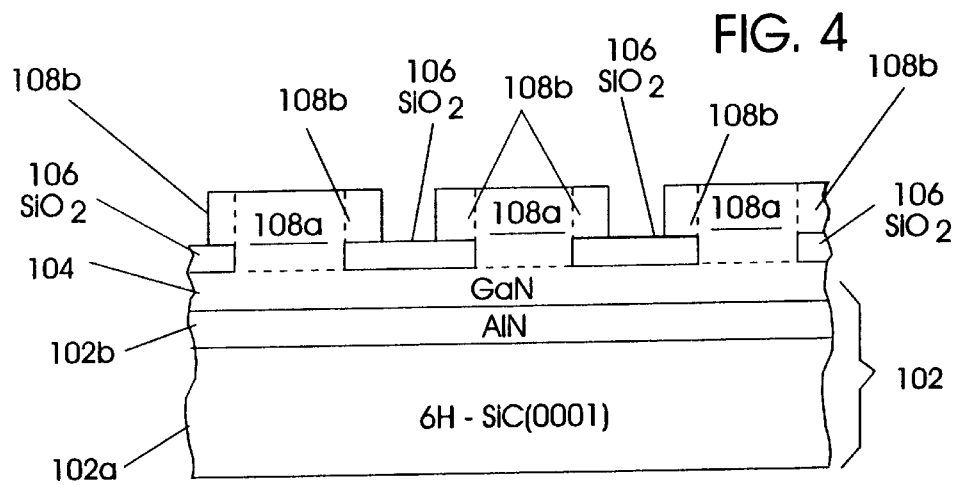

Referring now to FIG. 4, continued growth of the gallium nitride layer 108a causes lateral overgrowth onto the mask 106, to form lateral gallium nitride layer 108b. Growth conditions for overgrowth may be maintained as was described in connection with FIG. 3.

Figure 5:
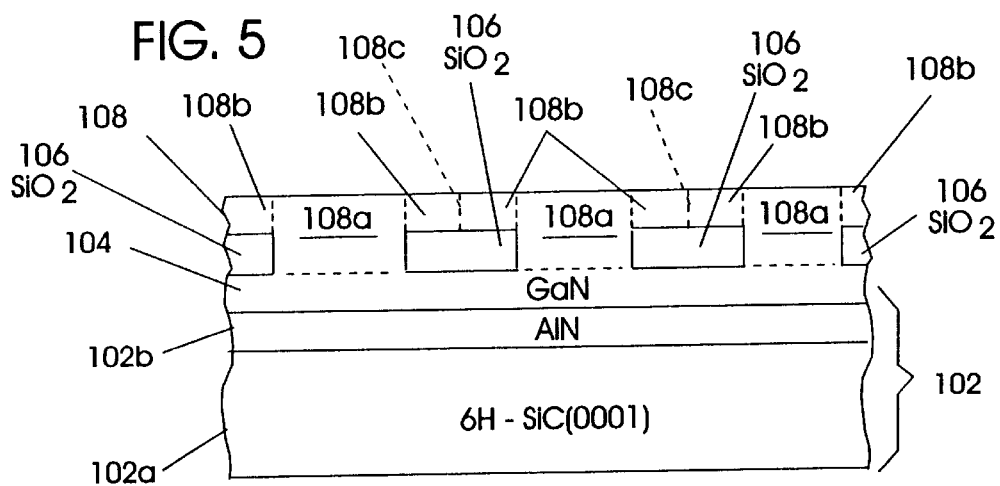

Referring now to FIG. 5, lateral overgrowth is allowed to continue until the lateral growth fronts coalesce at interfaces 108c, to form a continuous gallium nitride layer 108. The total growth time may be approximately 60 minutes. As shown in FIG. 1, microelectronic devices may then be formed in regions 108b. Devices may also be formed in regions 108a if desired.

Additional discussion of the methods and structures of the present invention will now be provided. As described above, the openings 107 in the mask are preferably rectangular stripes that preferably extend along the <11$\bar{2}$0> and/or <1$\bar{1}$00> directions on the underlying gallium nitride layer 104. Truncated triangular stripes having (1$\bar{1}$01) slant facets and a narrow (0001) top facet may be obtained for mask openings 107 along the <11$\bar{2}$0> direction. Rectangular stripes having a (0001) top facet, (11$\bar{2}$0) vertical side faces and (1$\bar{1}$01) slant facets may be grown along the <1$\bar{1}$00> direction. For growth times up to 3 minutes, similar morphologies may be obtained regardless of orientation. The stripes develop into different shapes if the growth is continued.

The amount of lateral growth generally exhibits a strong dependence on stripe orientation. The lateral growth rate of the <1$\bar{1}$00> oriented stripes is generally much faster than those along <11$\bar{2}$0>. Accordingly, it is most preferred to orient the openings 107 so that they extend along the <1$\bar{1}$00> direction of the underlying gallium nitride layer 104.

The different morphological development as a function of opening orientation appears to be related to the stability of the crystallographic planes in the gallium nitride structure. Stripes oriented along <11$\bar{2}$0> may have wide (1$\bar{1}$00) slant facets and either a very narrow or no (0001) top facet depending on the growth conditions. This may be because (1$\bar{1}$01) is the most stable plane in the gallium nitride wurtzite crystal structure, and the growth rate of this plane is lower than that of others. The {1$\bar{1}$01} planes of the <1$\bar{1}$00> oriented stripes may be wavy, which implies the existence of more than one Miller index. It appears that competitive growth of selected {1$\bar{1}$01} planes occurs during the deposition which causes these planes to become unstable and which causes their growth rate to increase relative to that of the (1$\bar{1}$01) of stripes oriented along <11$\bar{2}$0>.

The morphologies of the gallium nitride layers selectively grown on openings oriented along <1$\bar{1}$00> are also generally a strong function of the growth temperatures. Layers grown at 1000° C. may possess a truncated triangular shape. This morphology may gradually change to a rectangular cross-section as the growth temperature is increased. This shape change may occur as a result of the increase in the diffusion coefficient and therefore the flux of the gallium species along the (0001) top plane onto the {1$\bar{1}$01} planes with an increase in growth temperature. This may result in a decrease in the growth rate of the (0001) plane and an increase in that of the {1$\bar{1}$01}. This phenomenon has also been observed in the selective growth of gallium arsenide on silicon dioxide. Accordingly, temperatures of 1100° C. appear to be most preferred.

The morphological development of the gallium nitride regions also appears to depend on the flow rate of the TEG. An increase in the supply of TEG generally increases the growth rate of the stripes in both the lateral and the vertical directions. However, the lateral/vertical growth rate ratio decrease from 1.7 at the TEG flow rate of 13 $\mu$mol/min to 0.86 at 39 mol.min. This increased influence on growth rate along <0001>relative to that of <11$\bar{2}$0> with TEG flow rate may be related to the type of reactor employed, wherein the reactant gases flow vertically and perpendicular to the substrate. The considerable increase in the concentration of the gallium species on the surface may sufficiently impede their diffusion to the {1$\bar{1}$01} planes such that chemisorption and gallium nitride growth occur more readily on the (0001) plane.

Continuous 2 $\mu$m thick gallium nitride layers 108 may be obtained using 3 $\mu$m wide stripe openings 107 spaced 7 $\mu$m apart and oriented along <1$\bar{1}$00>, at 1100° C. and a TEG flow rate of 26 $\mu$mol/min. The overgrown gallium nitride regions 108b may include subsurface voids that form when two growth fronts coalesce. These voids may occur most often using lateral growth conditions wherein rectangular stripes having vertical {11$\bar{2}$0} side facets developed.

The coalesced gallium nitride 108 layer may have a microscopically flat and pit-free surface. The surfaces of the laterally grown gallium nitride layers may include a terrace structure having an average step height of 0.32 nm. This terrace structure may be related to the laterally grown gallium nitride, because it is generally not included in much larger area films grown only on aluminum nitride buffer layers. The average RMS roughness values may be similar to the values obtained for the underlying gallium nitride layers 104.

Threading dislocations, originating from the interface between the gallium nitride underlayer 104 and the buffer layer 102b, appear to propagate to the top surface of the vertical gallium nitride layer 108a within the openings 107 of the mask 106. The dislocation density within these regions is approximately $10^9$ cm$^{-2}$. By contrast, threading dislocations do not appear to readily propagate to in the overgrown regions 108b. Rather, the overgrown gallium nitride regions 108b contain only a few dislocations. These few dislocations may be formed parallel to the (0001) plane via the extension of the vertical threading dislocations after a 90° bend in the regrown region. These dislocations do not appear to propagate to the top surface of the overgrown GaN layer.

As described, the formation mechanism of the selectively grown gallium nitride layer is lateral epitaxy. The two main stages of this mechanism are vertical growth and lateral growth. During vertical growth, the deposited gallium nitride grows selectively within the mask openings 107 more rapidly than it grows on the mask 106, apparently due to the much higher sticking coefficient, s, of the gallium atoms on the gallium nitride surface (s~1) compared to on the mask (s~1). Since the $SiO_2$ bond strength is 799.6 kJ/mole and much higher than that of Si—N (439 kJ/mole), Ga—N (103 kJ/mole), and Ga—O (353.6 kJ/mole), Ga or N atoms should not readily bond to the mask surface in numbers and for a time sufficient to cause gallium nitride nuclei to form. They would either evaporate or diffuse along the mask surface to the opening 107 in the mask or to the vertical gallium nitride surfaces 108a which have emerged. During lateral growth, the gallium nitride grows simultaneously both vertically and laterally over the mask from the material which emerges over the openings.

Surface diffusion of gallium and nitrogen on the mask may play a minor role in gallium nitride selective growth. The major source of material appears to be derived from the gas phase. This may be demonstrated by the fact that an increase in the TEG flow rate causes the growth rate of the (0001) top facets to develop faster than the $(1\bar{1}01)$ side facets and thus controls the lateral growth.

The laterally grown gallium nitride 108b bonds to the underlying mask 106 sufficiently strongly so that it generally does not break away on cooling. However, lateral cracking within the $SiO_2$ may take place due to thermal stresses generated on cooling. The viscosity ($\rho$) of the $SiO_2$ at 1050° C. is about $10^{15.5}$ poise which is one order of magnitude greater than the strain point (about $10^{14.5}$ poise) where stress relief in a bulk amorphous material occurs within approximately six hours. Thus, the $SiO_2$ mask may provide limited compliance on cooling. As the atomic arrangement on the amorphous $SiO_2$ surface is quite different from that on the GaN surface, chemical bonding may occur only when appropriate pairs of atoms are in close proximity. Extremely small relaxations of the silicon and oxygen and gallium and nitrogen atoms on the respective surfaces and/or within the bulk of the $SiO_2$ may accommodate the gallium nitride and cause it to bond to the oxide.

Accordingly, regions 108b of lateral epitaxial overgrowth through mask openings 107 from an underlying gallium nitride layer 104 may be achieved via MOVPE. The growth may depend strongly on the opening orientation, growth temperature and TEG flow rate. Coalescence of overgrown gallium nitride regions to form regions with both extremely low densities of dislocations and smooth and pit-free surfaces may be achieved through 3 $\mu$m wide mask openings spaced 7 $\mu$m apart and extending along the $<1\bar{1}00>$ direction, at 1100° C. and a TEG flow rate of 26 $\mu$mol/min. The lateral overgrowth of gallium nitride via MOVPE may be used to obtain low defect density regions for microelectronic devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A gallium nitride semiconductor structure comprising:
   an underlying gallium nitride layer having defect density of at least $10^8$ cm$^{-2}$;
   a patterned layer that includes an array of openings therein, on the underlying gallium nitride layer;
   a vertical gallium nitride layer having defect density of at least $10^8$ cm$^{-2}$ that extends from the underlying gallium nitride layer and through the array of openings; and
   a lateral gallium nitride layer having defect density of less than $10^4$cm$^{-2}$ that extends from the vertical gallium nitride layer onto the patterned layer opposite the underlying gallium nitride layer.

2. A structure according to claim 1 further comprising:
   a plurality of microelectronic devices in the lateral gallium nitride layer.

3. A structure according to claim 1 wherein the lateral gallium nitride layer is a continuous monocrystalline gallium nitride semiconductor layer.

4. A structure according to claim 1 further comprising a substrate, and wherein the underlying gallium nitride layer is on the substrate.

5. A structure according to claim 4 further comprising a buffer layer between the substrate and the underlying gallium nitride layer.

6. A structure according to claim 1 wherein the patterned layer includes an array of openings therein, the openings extending along a $<1\bar{1}00>$ direction of the underlying gallium nitride layer.

7. A structure according to claim 1 wherein the patterned layer includes an array of openings therein, the openings extending along a $<11\bar{2}0>$ direction of the underlying gallium nitride layer.

8. A structure according to claim 1 wherein the patterned layer includes an array of first openings therein that extend along a $<11\bar{2}0>$ direction of the underlying gallium nitride layer, and an array of second openings therein that extend along a $<1\bar{1}00>$ direction of the underlying gallium nitride layer.

9. A structure according to claim 8 wherein the array of first openings and the array of second openings are arranged in a rectangle on the underlying gallium nitride layer, the rectangle having edges of predetermined lengths, and wherein a ratio of the of the predetermined lengths is proportional to a ratio of growth rates of a $\{11\bar{2}0\}$ facet and a $\{1\bar{1}01\}$ facet of the underlying gallium nitride layer.

10. A structure according to claim 1 further comprising:
    a microelectronic device in the lateral gallium nitride layer.

11. A monocrystalline gallium nitride layer of a predetermined defect density, including a plurality of spaced apart regions of lower defect density than the predetermined defect density, wherein the predetermined defect density is at least $10^8$ cm$^{-2}$ and wherein the lower defect density is less than $10^4$ cm$^{-2}$.

12. A layer according to claim 11 wherein the spaced apart regions are stripes that extend along a $<1\bar{1}00>$ direction of the layer.

13. A layer according to claim 1 wherein the spaced apart regions are stripes that extend along a $<11\bar{2}0>$ direction of the layer.

14. A layer according to claim 11 wherein the spaced apart regions comprise an array of first spaced apart regions that extend along a $<11\bar{2}0>$ direction of the layer, and an array of second spaced apart regions that extend along a $<1\bar{1}00>$ direction of the layer.

15. A layer according to claim 14 wherein the array of first regions and the array of second regions are arranged in a rectangle in the layer, the rectangle having edges of predetermined lengths, and wherein a ratio of the of the predetermined lengths is proportional to a ratio of growth rates of a $\{11\bar{2}0\}$ facet and a $\{1\bar{1}01\}$ facet of the layer.

16. A layer according to claim 11 further comprising:
   at least one microelectronic device in at least one of the spaced apart regions.

17. A gallium nitride semiconductor structure comprising:
   an underlying gallium nitride layer, having defect density of at least $10^8$ cm$^{-2}$;
   a lateral gallium nitride layer having defect density of less than $10^4$ cm$^{-2}$ that extends from the underlying gallium nitride layer; and
   at least one microelectronic device in the lateral gallium nitride layer.

18. A structure according to claim 17 further comprising:
   a vertical gallium nitride layer between the underlying gallium nitride layer and the lateral gallium nitride layer.

19. A structure according to claim 17 wherein the lateral gallium nitride layer is a continuous monocrystalline gallium nitride semiconductor layer.

20. A structure according to claim 17 further comprising a substrate, and wherein the underlying gallium nitride layer is on the substrate.

21. A structure according to claim 20 further comprising a buffer layer between the substrate and the underlying gallium nitride layer.

22. A structure according to claim 17 wherein the lateral gallium nitride layer includes spaced apart stripes that extend along a $<1\bar{1}00>$ direction of the underlying gallium nitride layer.

23. A structure according to claim 17 wherein the lateral gallium nitride layer includes spaced apart stripes that extend along a $<11\bar{2}0>$ direction of the underlying gallium nitride layer.

24. A structure according to claim 17 wherein the lateral gallium nitride layer includes an array of first spaced apart regions that extend along a $<11\bar{2}0>$ direction of the underlying gallium nitride layer, and an array of second spaced apart regions that extend along a $<1\bar{1}00>$ direction of the underlying gallium nitride layer.

25. A structure according to claim 24 wherein the array of first regions and the array of second regions are arranged in a rectangle in the lateral gallium nitride layer, the rectangle having edges of predetermined lengths, and wherein a ratio of the of the predetermined lengths is proportional to a ratio of growth rates of a $\{11\bar{2}0\}$ facet and a $\{1\bar{1}01\}$ facet of the lateral gallium nitride layer.

* * * * *